United States Patent [19]
Chang et al.

[11] Patent Number: 4,994,871
[45] Date of Patent: Feb. 19, 1991

[54] INSULATED GATE BIPOLAR TRANSISTOR WITH IMPROVED LATCH-UP CURRENT LEVEL AND SAFE OPERATING AREA

[75] Inventors: Hsueh-Rong Chang, Scotia, N.Y.; Bantval J. Baliga, Raleigh, N.C.

[73] Assignee: General Electric Company, Schenectady, N.Y.

[21] Appl. No.: 279,392

[22] Filed: Dec. 2, 1988

[51] Int. Cl.⁵ .......................................... H01L 29/78
[52] U.S. Cl. ................ 357/23.4; 357/23.14; 357/34; 357/36; 357/37; 357/43; 357/52; 357/55; 357/68; 357/86; 357/42
[58] Field of Search ............. 357/23.4, 23.14, 34, 357/36, 37, 42, 43, 52, 55, 68, 86

[56] References Cited
PUBLICATIONS

Chang et al, -IEDM 87, Dec. 1987, pp. 674–677.
Ueda, Daisuke et al., "A New Injection Suppression Structure for Conductivity Modulated Power MOS-FETs", Extended Abstracts of the 18th (1986 International) Conference on Solid State Devices and Materials, Tokyo, 1986, pp. 97–100.
Nakagawa, Akio et al., "Experimental and Numerical Study of Non-Latch-Up Bipolar-Mode MOSFET Characteristics", IEDM 85, 1985, pp. 150–153.
Chang, H-R et al., "Insulated Gate Bipolar Transistor (IGBT) with a Trench Gate Structure", IEDM 87, Dec. 1987, pp. 674–677.

Primary Examiner—Edward J. Wojciechowicz
Attorney, Agent, or Firm—Marvin Snyder; James C. Davis, Jr.

[57] ABSTRACT

A UMOS IGBT has a source electrode ohmic contact area which is at least 40% base region and preferably at least 50% base region in order to provide a high latching current and a large safe operating area.

29 Claims, 10 Drawing Sheets

INSULATED GATE BIPOLAR TRANSISTOR WITH IMPROVED LATCH-UP CURRENT LEVEL AND SAFE OPERATING AREA

FIELD OF THE INVENTION

The present invention relates to power semiconductor devices, and more particularly, to power insulated gate bipolar transistor devices.

BACKGROUND INFORMATION

An insulated gate bipolar transistor (IGBT) comprises a four layer structure having a source region, a base or body region, a drift region and a collector region. These four regions are arranged in series and alternate in conductivity type. The source, base and drift regions structurally form an MOS field effect transistor. The collector region is provided in order to inject carriers into the drift region when the device is ON to thereby reduce the ON-resistance of the device. This device is turned ON by a gate voltage which renders a channel extending through the base region from the source region to the drift region conductive and is turned OFF by rendering that channel non-conductive.

For devices which are designed to hold off relatively large voltages such as greater than about 10-20 volts, and particularly greater than 50-100 volts, a MOSFET must have a relatively wide, lightly doped drift portion of its drain region. As a consequence, the ON-resistance of such a MOSFET device is relatively high because the device current must traverse the wide, "high" resistance drift portion of the drain region. In the IGBT the injection of carriers from the collector region into the drift region modulates (increases) the conductivity of the drift region when the device is ON by substantially increasing the mobile charge carrier density in that region. This has the effect of substantially reducing the device ON-resistance. For this reason, the IGBT is considered a preferable device to an MOSFET for high voltage devices where a low ON-resistance is desired.

Unfortunately, the advantages provided by the IGBT do not come without accompanying penalties. In particular, one problem faced with an IGBT is the fact that its four layer structure is like that of a thyristor. Consequently, if the source/base PN junction becomes forward biased, the device enters a thyristor or latched mode in which the MOS gate of the device cannot turn the device OFF. This loss of gate control results in improper circuit operation and can destroy the device. The source/base junction in an IGBT can become forward biased during normal operation if majority carrier flow in the base region (the carriers injected by the collector region) adjacent to the source region is sufficient to cause a voltage drop equal to a diode forward voltage drop across any portion of the source/base junction. Such a voltage is most likely to develop at a point remote from the base-to-source electrode contact area. The voltage drop created by majority carriers flowing in the base region results from the small but finite resistance exhibited by the base region. Therefore, a sufficient quantity of carriers and a long enough resistive path can combine to produce the necessary voltage drop (about 0.7 volts in silicon devices) to forward bias a portion of the source/base junction. The main current level at which part of the source/base junction becomes forward biased, thereby latching the device in a thyristor mode is known as the latching current of an IGBT. The latching current of an IGBT varies with the internal structure of the IGBT.

The safe operating area (SOA) of a device is a measure of its ability to turn off current in an inductive load. The boundaries of the safe operating area are limited by a combination of the voltage applied across the device and the current flowing through the device and depends on device structure and characteristics. The larger a device's SOA is, the larger the inductive current that device can turn off without damage to the device. When the device turns off while controlling an inductive load, the voltage across the device increases substantially while the inductive load prevents the current from decreasing to zero immediately. The safe operating area of the device is substantially affected by the mobile charge carrier density within the device during turn off because the presence of mobile charge carriers results in increased internal electric fields within the device structure. As a result of its bipolar nature an IGBT has a substantially greater stored charge density than a MOSFET of similar structure. Consequently, the safe operating area of an IGBT is substantially less than that of a corresponding MOSFET structure. This is a second penalty to which an IGBT is subject.

There is a need for an IGBT structure in which the ON-resistance is low, the latching current is high and the safe operating area is large.

OBJECTS OF THE INVENTION

A primary object of the present invention is to provide an IGBT structure having a high latching current and a large safe operating area.

A further object of the present invention is to provide an IGBT structure having a high latching current and a large safe operating area in combination with a low ON-resistance.

A further object of the present invention is to provide an IGBT structure which affects the latching current level and safe operating area in a known manner thereby enabling the structure to be adjusted to provide a desired level of latching current and size of its safe operating area.

SUMMARY OF THE INVENTION

The present invention accomplishes the above and other objects which will become apparent hereinafter by providing an IGBT having a vertical current path and a UMOS gate structure which (1) minimizes the flow of base region majority carriers along the length of the source/base junction to thereby maximize the latching current and (2) provides a large base/source electrode contact area to aid in the rapid removal of stored carriers from the drift region during device turn-off.

In one embodiment of this invention, a UMOS IGBT structure provides a pedestal portion of the device in which the source region and the base region are located. Some portions of the pedestal structure include portions of the source region while other portions of the pedestal structure are free of the source region. The source-region-free portions of the pedestal are positioned close to the portions in which the source region is located, but in a manner in which base region majority carriers which flow in the source-free portion do not flow along any portion of the source/base junction and thereby do not contribute to the voltage drop which induces latching.

The pedestal structure of the devices in accordance with the present invention may comprise either (1) a plurality of elongated pedestal segments which may be oriented either parallel or concentrically with respect to each other or (2) a grid configuration, either in which the pedestal structure forms the lines of the grid with the trenches of the UMOS structure comprising the apertures in the grid or in which the UMOS trenches form the lines of the grid with the pedestal structure forming the apertures in the grid.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
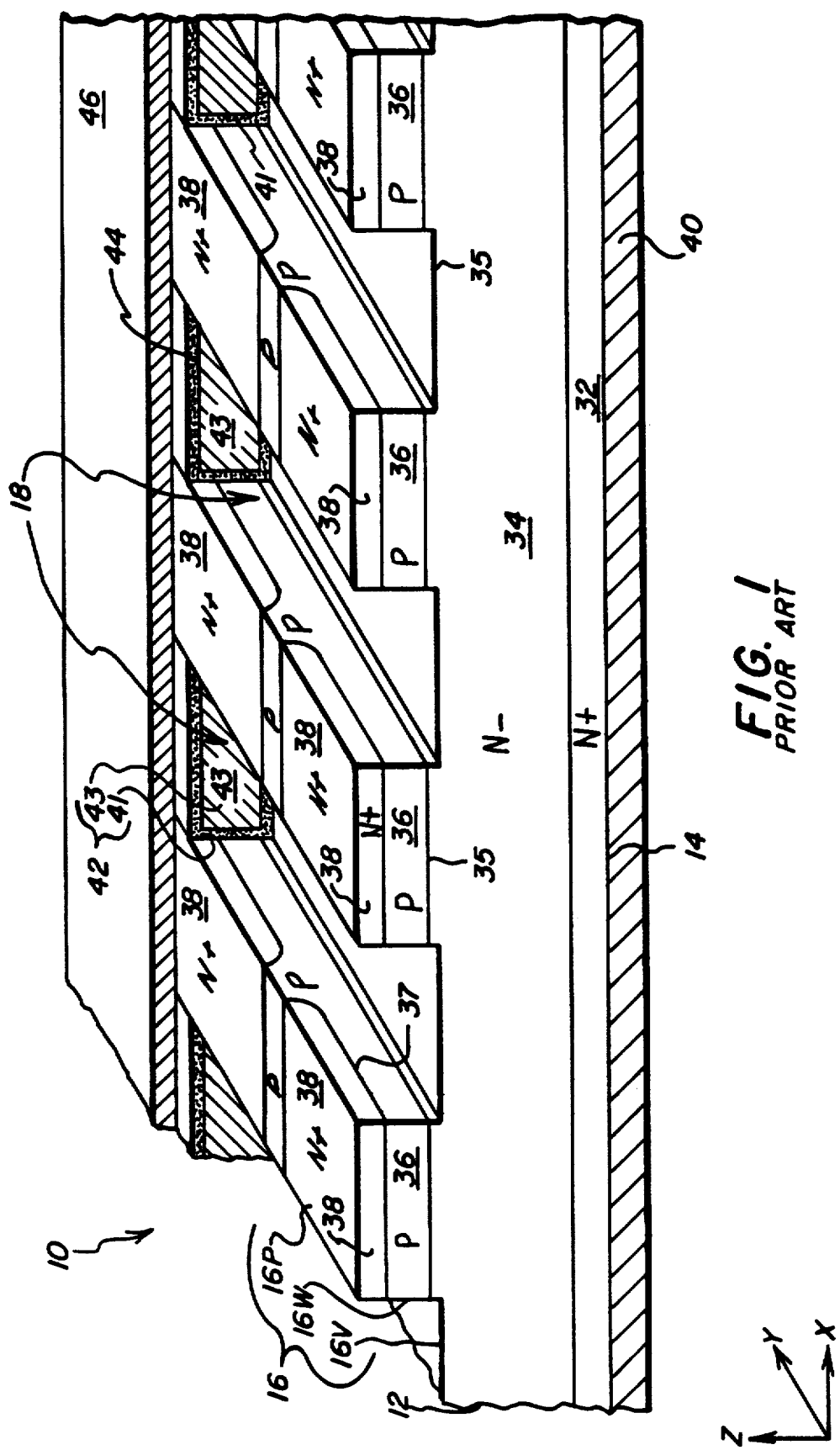
FIG. 1 illustrates a prior art UMOSFET structure in perspective view.

In FIG. 1, a prior art UMOSFET is shown generally at 10. The device 10 comprises a body 12 of semiconductor material having a lower surface 14 and an upper surface 16 comprised of a planar plateau portion 16P, a pedestal wall portion 16W and a valley portion 16V disposed at the bottom of the UMOS trenches. Together, the surface portions 16P, 16W and 16V form the upper major surface of the semiconductor body 12. In the FIG. 1 illustration, UMOS trenches 18 are disposed parallel to each other and extend in the Y-direction in accordance with the coordinate system shown in the lower lefthand portion of the figure. The trenches 18 define separate pedestal segments which are elongated in the Y-direction and spaced apart in the X-direction.

Within the body 12 of semiconductor material, an N+ drain region 32 is disposed adjacent the lower surface 14. In high voltage devices, this drain region includes a lightly doped N type (N—) drift region portion which is spaced from the lower surface 14 by the heavily doped portion 32 of the drain region. The heavily doped portion provides a low resistance ohmic contact to a drain electrode 40, while the lightly doped drift portion enables the device to hold off or support large OFF-state voltages. The drift region 34 extends to the valley portion 16V of the upper surface of the semiconductor body and preferably a distance into the pedestal portion of the UMOS structure. A P type base region 36 is disposed within the pedestal portion of the structure and forms a first PN junction 35 with the N type drift region 34. A source region 38 of N type material (N+) extends into the pedestal structure from the plateau surface 16P and forms a second PN junction 37 with the base region 36. At spaced apart locations along the Y-direction length of the pedestal, the base region 36 extends to the upper surface 16P of the pedestal in order to come into contact with an overlying source electrode 46 which, in the illustration, is shown only toward the back of the figure in order to more clearly illustrate the details of the structure.

The vertical wall surfaces 16W and the valley surface 16V of the semiconductor body have a gate dielectric layer 41 disposed thereon (shown toward the back of the figure). As is well known, in silicon devices such a gate dielectric is preferably a thermally grown silicon oxide. Most of the remainder of the trench is filled with gate conductor material 43. The gate dielectric 41 and the gate conductor material 43 together comprise an insulated gate electrode 42.

A further dielectric layer 44 is disposed on top of the gate conductor 43 in order to insulate the gate conductor from an overlying source electrode 46. The dielectric 44 preferably has its upper surface disposed flush with the planar plateau portion 16P of the upper surface of the semiconductor body. The conductive portion 43 of the gate electrode 42 preferably extends from adjacent the drift region near the lower portion of the pedestal to adjacent the source region near the upper portion of the pedestal to ensure that application of a gate voltage to the gate electrode 42 will properly control the existence of a conductive channel through the base region 36 between the source region 38 and the drift region 34.

The regions of contact between the base region 36 and the source electrode 46 are spaced apart in the Y-direction and are relatively narrow since their purpose is to fix the potential of the base region at the potential of the source electrode rather than to carry large currents. The potential of the base region needs to be fixed in order that positive control of the potential difference between the base region and the gate electrode may be maintained to properly control device operation. In a typical prior art UMOSFET, the area of the contact between the base region and the source electrode is in the range of 10-35% of the source electrode's ohmic contact area.

Figure 2:
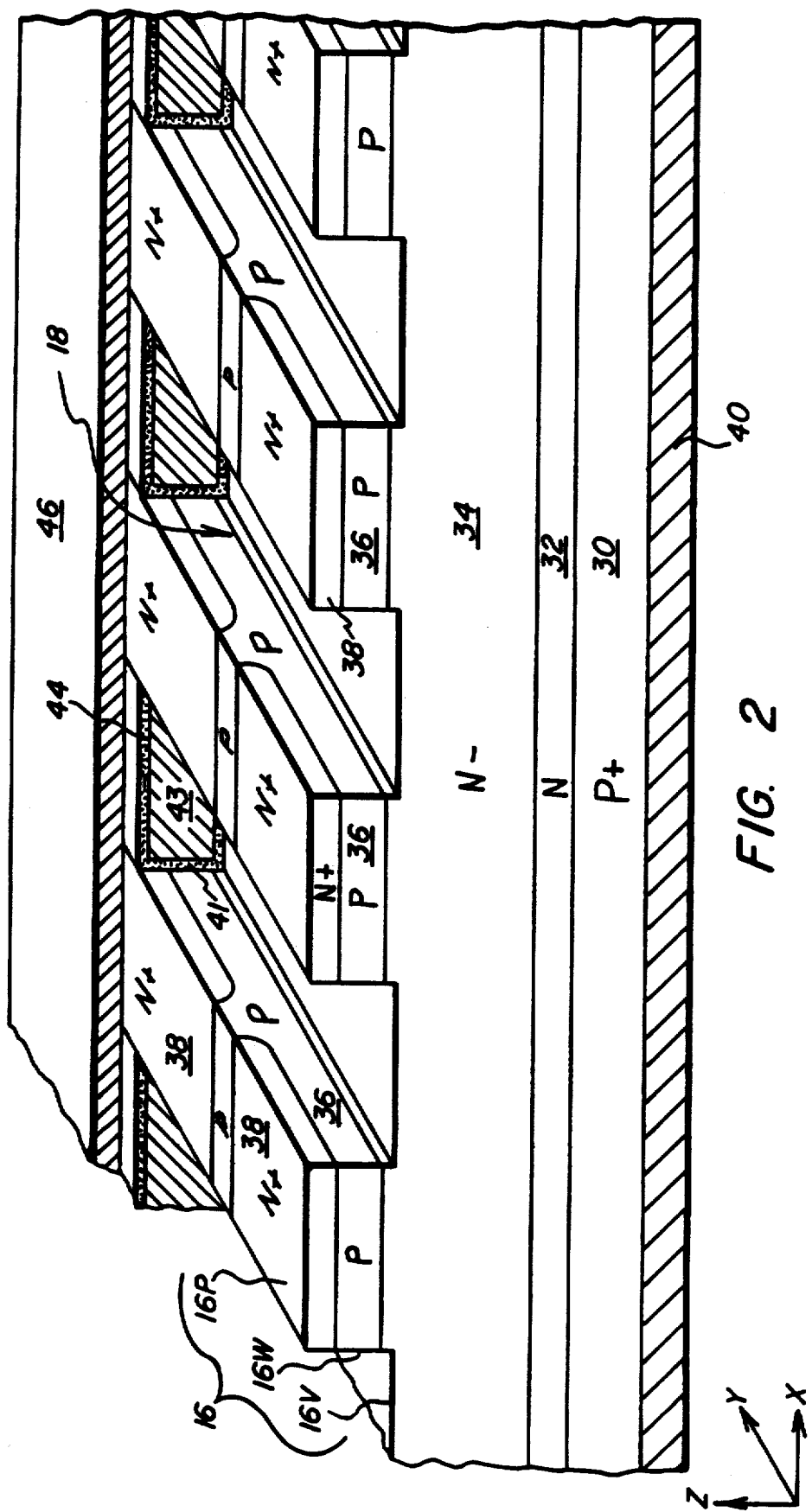
FIG. 2 illustrates the UMOSFET of FIG. 1 converted to a UMOS IGBT.

As is known in the art, the UMOSFET of FIG. 1 may be converted into an IGBT as shown in FIG. 2 by inserting a P type region 30 between the drain region 32 and the electrode 40 to provide a four layer device. Unfortunately, we have determined that such a UMOS IGBT exhibits a relatively low latching current and a relatively small safe operating operating area. This is because holes injected from the collector region into the drift region flow vertically through the drift region and cross into the base region 36. At that point, these holes must flow along the Y-direction length of a pedestal to the nearest base-to-source electrode contact area. The longer the source region is, the smaller the hole current is which is necessary to develop a diode forward voltage drop across the source/base junction 37 at a point midway between two base region contact areas. Thus, direct conversion of a prior art UMOSFET structure into a UMOS IGBT does not provide an IGBT whose operating characteristics are ideal.

In accordance with the present invention, the base contact area to the source electrode in a UMOS IGBT is preferably at least 40% of the source electrode's ohmic contact area to the semiconductor body. It is preferred that the base contact area be at least 50% of that area in order to provide a high latching current and a large SOA. By the contact area of the source electrode it is meant the area of the source electrode which forms an ohmic contact to either the source region or the base region. That is, the portion of the source electrode which is disposed over the gate electrode and thus not in ohmic contact with the semiconductor body is ignored in calculating these percentages. These percentages are selected because they provide a device with a high enough latching current to prevent latching and a significantly increased safe operating area. The purpose of this structure is to maximize the base contact area, consistent with maintaining sufficient channel width to ensure adequate base drive to the inherent bipolar transistor of the IGBT to maintain a low ON-resistance. Put in another way, the objective is to ensure that the base region current path along the source region is kept short while providing a low resistance contact between the base region and the source electrode.

Figure 3:
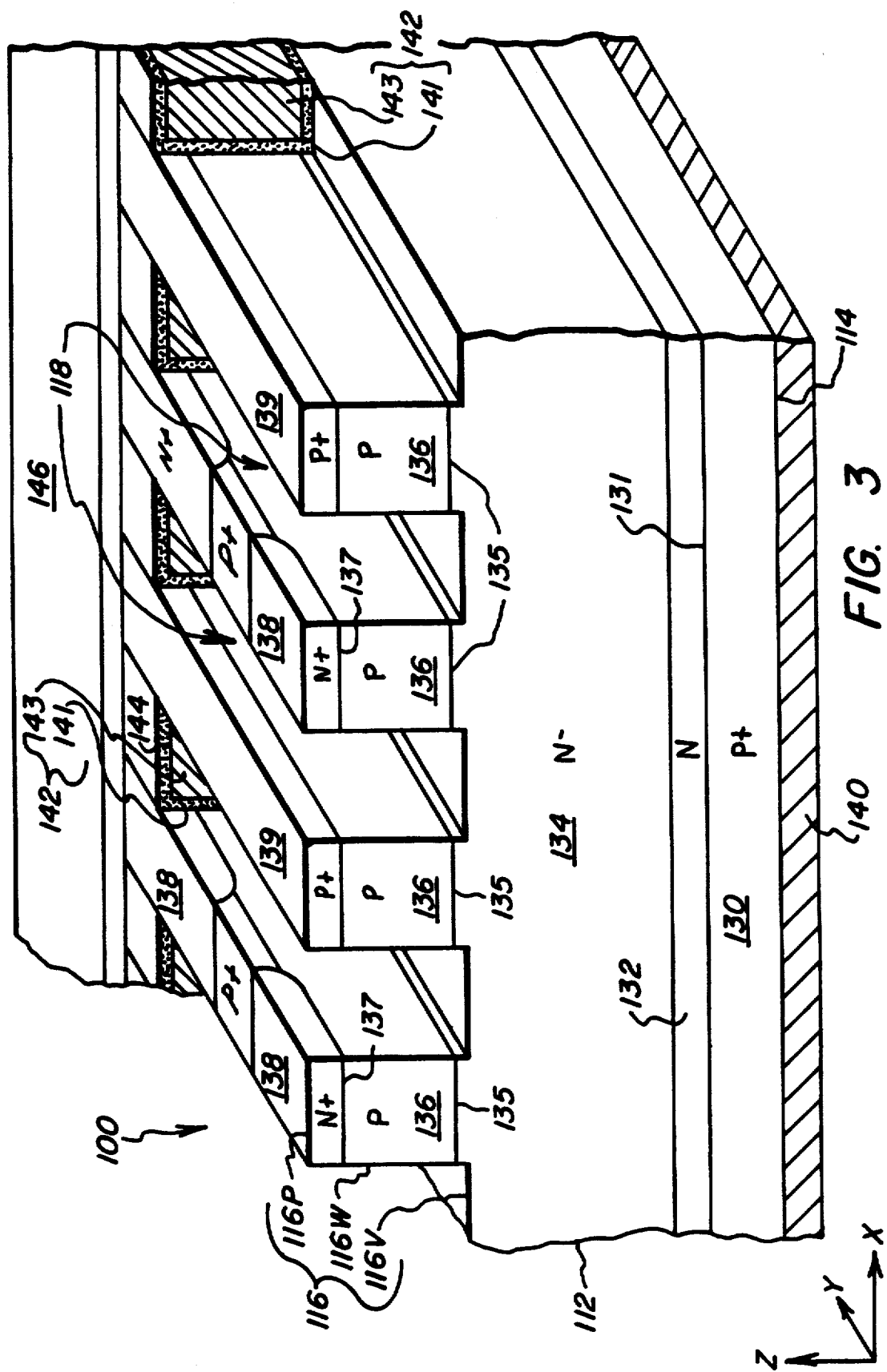
FIG. 3 illustrates one embodiment of a UMOS IGBT in accordance with the present invention in a perspective cross-section view.

In FIG. 3, one embodiment of a UMOS IGBT 100 in accordance with the present invention is illustrated in perspective cross-section. This IGBT 100 comprises a body 112 of semiconductor material having a lower surface 114 and an upper surface 116 which is comprised of a planar plateau portion 116P, a pedestal wall portion 116W and a valley portion 116V.

The body 112 of semiconductor material comprises a P+ collector region 130 disposed adjacent its lower surface 114, an N type buffer portion 132 of the drift region may be disposed directly adjacent the collector region 130 as shown. The N type drift region (or its buffer portion if present) forms a PN junction 131 with the collector region 130. The lightly doped (N−) portion 134 of the drift region extends upward to the valley portion 116V of the upper surface and into the pedestal portion of the structure. A base region 136 of P type material is disposed in the pedestal and forms a PN junction 135 with the drift region 134. Within some of the pedestal segments, portions or segments of a source region 138 are disposed adjacent the planar plateau portion 116P of the upper surface. These source region segments form a PN junction 137 with the P type base region 136. In others of the pedestal segments, a heavily doped (P+) portion 139 of the base region is disposed adjacent the plateau surface 116P. An insulated gate electrode 142 comprised of a dielectric layer 141 and a conductive material 143 is disposed in UMOS trenches 118 to provide control of the conductivity of a channel portion of the base region 136 directly adjacent to the trenches. The channel extends from the source region 138 to the drift region 134.

The gate electrode is shown adjacent all pedestal segments, including those which do not have a source region therein. The gate electrode may be spaced from the sourceless pedestal segments, if desired. However, for convenience in device fabrication, it is simpler to build the device with the gate electrode substantially filling the trench and thus disposed adjacent both types of pedestal segments. The source electrode 146 extends across the entire upper surface of the device making ohmic contact to (1) the source region 138, (2) the base region 136 where it extends to the upper surface in those pedestal segments containing the source region and to the P+ portion 139 of the base region in the pedestals which do not contain a source region segment. The source region segments and the base-to-source electrode contact zones are preferably of substantially equal Y-direction length in those pedestal segments having source regions. This ensures against latchup of the device and provides a high current carrying capacity for the base-to-source electrode contact. The source region segments preferably have a Y-direction length of less that 10 or 12μ and are preferably about 6μ or less in Y-direction length. The pedestals are preferably 3–4μ or less wide. The current limit of the SOA is a strong function of pedestal width for narrow pedestals (less than about 20μ) and increases with decreasing pedestal width. Breakdown voltage without current flow also increases with decreasing pedestal width. Thus, keeping the pedestals narrow is beneficial both for the SOA (dynamic breakdown) and the static breakdown voltage characteristics of the device.

The device 100 may be fabricated by providing a wafer having P type doping of the level desired for the collector region 130, forming the N type buffer 132 on one surface thereof by epitaxial growth, and then forming the N type drift region 134 on the buffer region 132 by epitaxial growth. The P type base region is formed by diffusing it into the upper surface of the drift region. Thereafter, the upper surface of the base region is masked for source diffusion in a manner in which the X-direction boundaries of the source region are located within the region where the UMOS trenches 118 will be formed. A second window is then opened for the diffusion of the P+ portion 139 of the base region, again with the edges of the P+ regions being preferably located within the region where the UMOS trenches 118 will be formed. Thereafter, the windows for the formation of the UMOS trenches are formed, the trenches are etched, the trench walls are thermally oxidized, the gate electrode is deposited within the trenches (and removed from over the source and base region plateau surfaces if initially deposited on those surfaces) and an insulating layer is formed over the gate electrode. Finally, the collector and source electrodes are deposited respectively on the lower and upper surfaces of the semiconductor body.

In operation, this device is connected into a circuit in the same manner as any other IGBT. That is, the main current path is connected between the source electrode 146 and the collector electrode 140 with the gate electrode 142 connected to control the conductivity of the device. For the device region conductivities shown and described, the collector electrode 140 is biased positive relative to the source electrode 146. The device is turned on by applying a positive voltage to the gate 142 to induce the formation of an electron-conductive channel in the base region extending from the source region 138 to the drift region 134. The resulting electron current serves as base current for the PNP transistor formed by the collector region 130, the drift region 134 and the base region 136. As a result of this base current, the PNP transistor turns on and the collector region 130 injects holes into the drift region 134. Carrier injection is normally associated with the emitter region of a bipolar transistor, but historically in this device, the source region was viewed as emitter-like with the region designated collector being viewed as the collector; we have designated the collector region accordingly for consistency with historical usage. The holes injected by the collector serve several purposes. First, they accumulate in the drift region where an equivalent number of electrons also accumulate for charge neutrality. This accumulation of mobile carriers modulates (increases) the conductivity of the drift region and thereby reduces the ON-resistance of the device. Second, these holes carry the bipolar portion of the device's ON-state current. Since in a low resistance, high voltage IGBT the majority of the ON-state current is carried as a bipolar current, the presence of these holes is crucial to proper device operation.

In the device structure shown in FIG. 3, for equal pedestal width, more holes flow into the pedestals having no source region than flow into the pedestals having a source region. This is because if the hole flows were equal, then the large area, direct ohmic contact between the base region portion 139 and the source electrode 146 would result in a lower potential at the junction 135 in the sourceless pedestals than in the pedestals having source region segments. This lower potential would attract additional holes. The hole flow distributes to provide roughly equal base/drift region junction potentials in the pedestals having source region segments and in the pedestals without source region segments. As a consequence of this pattern of hole flow, this devcce structure provides a substantially higher latching current than a device in which all pedestals include source region segments, since the device can conduct substantially more hole current before a latching voltage appears across the source/base junction. By appropriate control of the spacing between and the width of the base region/source electrode contact areas in the pedestals containing source region, this device can be designed to provide almost any desired latching current level. Unlike many other IGBT structures, increasing the latching current in this manner does not drastically effect the device ON-resistance because of the large channel width provided by the UMOS structure which ensures the provision of sufficient base current to drive the PNP transistor.

In this structure, the same features which contribute to a high latching current also contribute to the provision of a large safe operating area. This is because during turn-off, holes within the drift region flow rapidly into and through the base region segment and on to the source electrode. This reduces the tendency of these mobile charge carriers to contribute to avalanche breakdown of the base/drift junction which can contribute to device destruction.

Thus, the embodiment 100 of the present invention shown in FIG. 3 accomplishes the objectives of providing a high latching current and a large safe operating area without adversely effecting the ON-resistance of the device.

Figure 4:
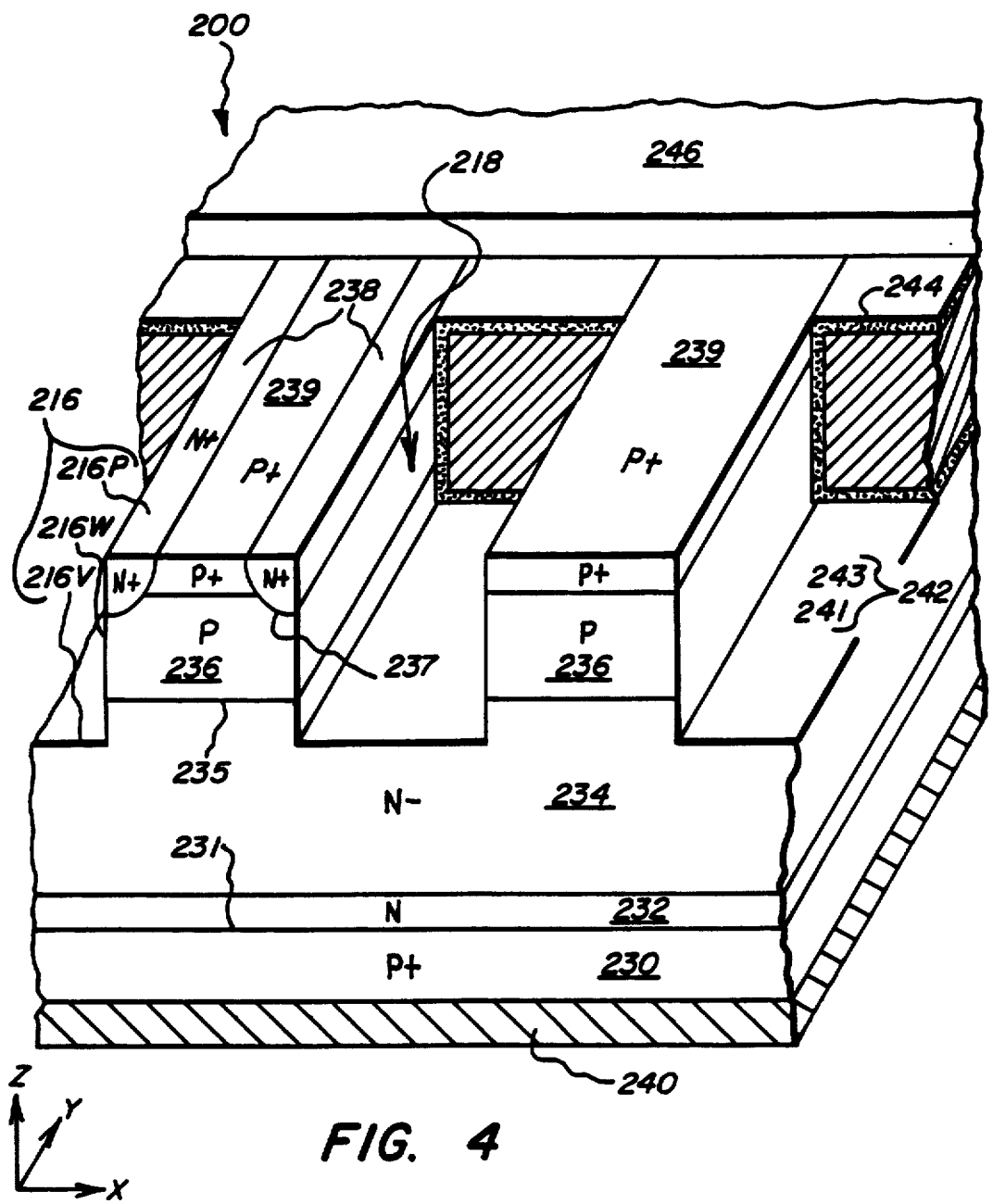
FIGS. 4-10 are perspective cross-section illustrations of alternative embodiments of a device in accordance with the present invention.

An alternative, self-aligned embodiment 200 of a device in accordance with the present invention is illustrated in a perspective, cross-section view in FIG. 4. In FIG. 4, reference numerals in the 200's have been used. Reference numerals which end in the same final two digits in FIGS. 3 and 4 identify corresponding portions of the structure. Those portions of the structure which are unchanged from earlier figures are not specifically discussed here and the reader is referred to the discussion of the corresponding structure in earlier figures for an explanation of those structures and their functions. It will be observed that the primary differences between the device 200 and the device 100 are in the configurations of the source region 138 and the contact area between the base region 136 and the source electrode 146 in those pedestals having source region segments therein. Sourced and sourceless pedestals alternate in device 200 in the same manner as in device 100.

In this structure, the pedestal segments which include source region segments have their source region segments 238 extending along the Y-direction length of their plateau surface 216P adjacent their mesa wall surfaces 216W. These source region segments 238 extend only partially across the pedestal's X-direction width. The base region extends to the upper surface of the pedestal along the full Y-direction length of the pedestal between the two source region segments 238 of that pedestal. This base region extension to the upper surface is X-direction centered on the pedestal. It is preferred to include a heavily doped P+ portion 239 of the base region adjacent the plateau surface 216P between the source region segments 238. This ensures that a good ohmic contact is formed between the source electrode and the base region. P+ portion 239 also increases the conductivity of that portion of the base region thereby reducing the voltage developed by holes flowing along the source/base junction within the base region on their way from the collector region 230 to the source electrode 246. For a pedestal width of 3 microns, where the source region segments have X-direction widths at the upper surface of 1 micron each, the base region contact to the emitter electrode also has a width of 1 micron. For cylindrical junctions between the source region segments and the base region (that is where the PN junction 237 is a quarter circle in the plane of the cross-section), the source/base junction has a length of only about 1.52 microns from its corner adjacent the mesa wall surface 216W to its corner adjacent the plateau surface 216P. Since contact is provided between the base region and the source electrode along the entire Y-direction length of the pedestal, there is nothing to induce hole flow in the Y-direction along the source/base region junction. Further, the high doping level of the portion 239 of the base region reduces the base region resistance as compared to prior art structures in which a substantial portion of the hole current path in the base region is horizontal under a source region. Consequently, this structure provides an exceedingly short hole-current path adjacent the source/base junction and thereby minimizes the voltage drop along that path. This short current path in combination with the presence of the laterally adjacent sourceless pedestals effectively ensures that the latching current for this structure will exceed the saturation current in almost all situations. Consequently, this structure effectively ensures that the device will not latch.

Software simulations of the operation of this device structure establish that the presence of a P+ portion 239 of the base region between the source region segments 238 of a sourced pedestal does not adversely effect breakdown voltage. Even with P+ region 239 present, the two locations where the breakdown problems are most significant are at the drift/base junction 235 and at the lower corner of the UMOS trenches where the upper surface's valley portion 216V meets the upper surface's wall portion 216W. Breakdown at this corner can be adjusted by controlling the trench formation process to provide a round corner rather than an abrupt right angle corner at this location and by providing a thick oxide between the gate electrode and that corner to minimize field strength at that location. Control of the breakdown voltage of the base/drift junction 235 is well understood in the art and need not be discussed here.

The device 200 operates in substantially the same manner as the device 100. The structure of the device 200 may be modified in several different ways. First, the ratio of sourced-to-sourceless pedestals may be changed from the 1:1 ratio provided by the alternating sourced and sourceless pedestals discussed above. For the alternating sourced and sourceless pedestals, the base contact area to source contact area ratio is 2:1. If two sourced pedestals are disposed between adjacent sourceless pedestals then for 3 micron wide pedestals and 1 micron wide source regions, a base contact area to source contact area ratio of 5:4 results. The inclusion of three sourced pedestals in succession between adjacent sourceless pedestals results in a base contact area to sourced contact area ratio of 1:1. This is a ratio which is expected to provide latch free operation in accordance with the present invention. However, consideration needs to be given to the actual hole flow patterns which result in the device structure, since the increased separation between the middle of the three sourced pedestals and the nearest laterally adjacent sourceless pedestal cause hole flow to include a significant lateral component because of divertion of holes injected under that middle sourced pedestal to the sourceless pedestal. This same effects exists to a lesser extent with two sourced pedestals in succession between adjacent sourceless pedestals. The problem of lateral flow would be minimized by making all of the pedestals sourced. However, such a structure has a base contact area to source contact area ratio of 1:2 which is low enough that latching is likely to occur at high currents. For these reasons, alternating sourced and sourceless pedestals provide a maximum latching current.

The latching current in an all-pedestals-sourced structure can be increased by making the pedestals wider to provide a wider base contact area and thus provide an increase in the base contact area to source contact area ratio. However, this is not considered preferred because as has been discussed, increasing the pedestal width decreases both the device breakdown voltage and the size of the safe operating area.

As an alternative to alternating pedestals which have source regions extending along their entire Y-direction length with pedestals which are source free, a structure which is periodic in the Y-direction may be employed. That is, a first Y-direction extending portion of the pedestal may include source regions 238 of the type shown in device 200 with the adjacent Y-direction extending portion of the same pedestal being free of source regions. In pedestals of this type which are X-direction directly adjacent the position of the sourced and sourceless segments are preferably alternated so that the source-free portions of a pedestal are X-direction (i.e. laterally) aligned with the sourced portion of the adjacent pedestals and vice versa. While this structure is conceptually equivalent to the structure of device 200, there is a difference in device internal operation because in the vicinity of the location of the Y-direction end of the source regions there is a tendency for the hole current to flow in the Y-direction toward the sourceless portion of the pedestal and thus, a different voltage drop may develop along the source/base junction in that vicinity than along the remainder of the source region.

The FIG. 4 structure 200 may be fabricated in a manner similar to that in which the FIG. 3 structure 100 is fabricated, up through the diffusion of the base region. Thereafter, the P+ portion of the base region may be provided across the entire upper surface of the semiconductor body by diffusion. Windows are then opened for the diffusion of the source region. These windows coincide with eventual location of the UMOS trenches. The source region doping is then introduced and driven to provide a source region which extends a desired distance under the masking layer. Thereafter, the UMOS trenches are etched through the source diffusion windows, the gate electrode is deposited and the source and collector electrodes are applied.

This method of producing the source region and the UMOS trenches results in a totally self-aligned structure which ensures that the source region is of uniform width along each side of each pedestal and that the base region contact to the source electrode is everywhere centered within the pedestal in the X-direction. This self-alignment enables the device breakdown voltage and SOA to be maximized by provision of narrow pedestals without any penalties from mask alignment tolerances such as differing source region widths at opposing sides of pedestals. Further information on this device is contained in our paper with others entitled "Insulated Gate Bipolar Transistor (IGBT) With a Trench Gate Structure" given at the International Electron Devices Meeting, Dec. 6-9, 1987, which appears at pages 674-677 of the proceedings of that conference. That paper is incorporated herein by reference.

As an alternative to forming the P+ portion of the base region across the entire upper surface of the semiconductor body, the P+ portion of the base region may be introduced through appropriate windows in a masking layer on the upper surface of the device structure. However, this procedure is not preferred because it results in the mask alignment tolerance considerations with respect to locating the source region relative to the P+ portion of the base region.

Figure 5:
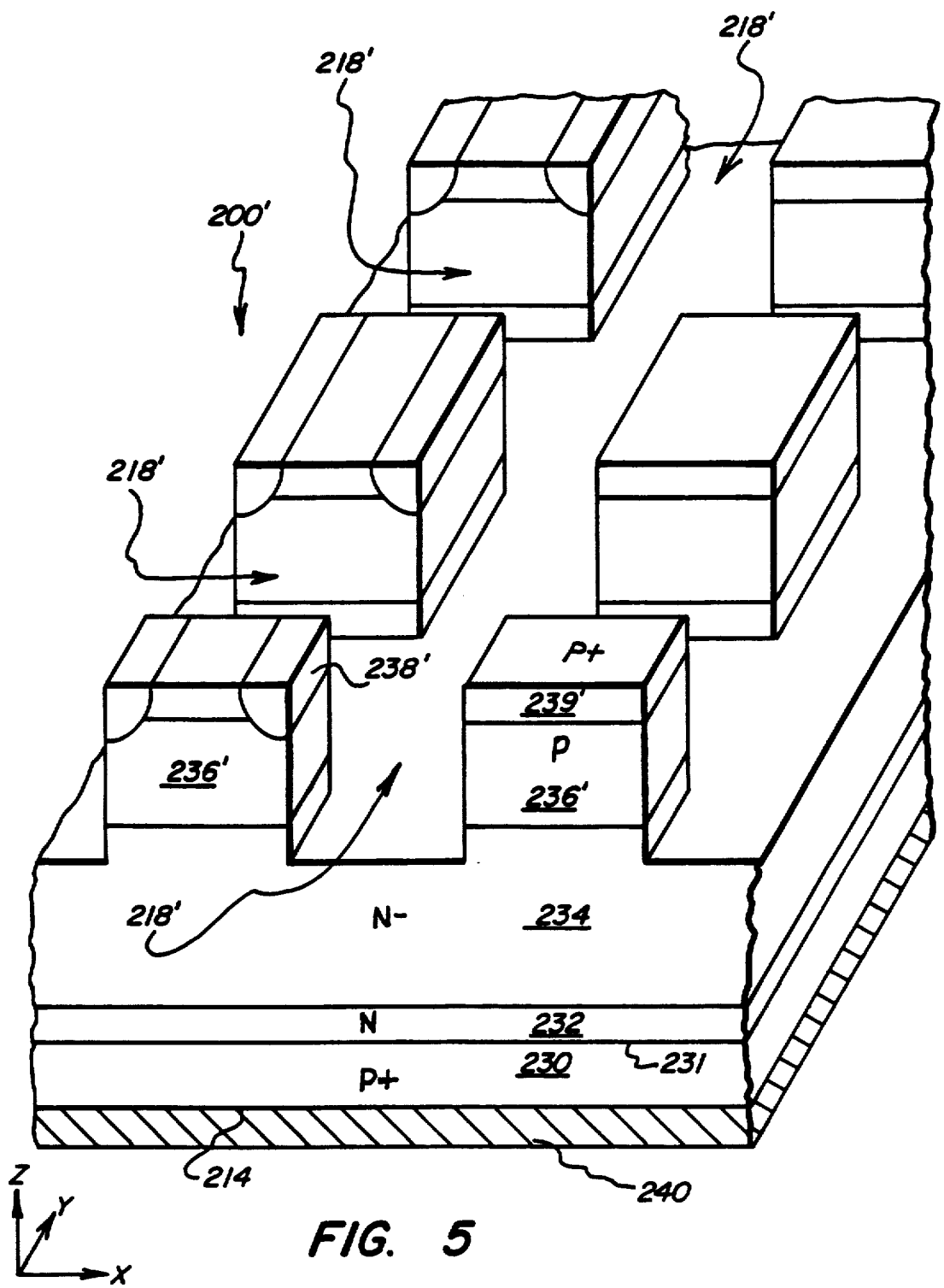

An alternative embodiment 200' of a device in accordance with the present invention is shown in perspective, cross-section view in FIG. 5. The device 200' is like the device 200 except that rather than the UMOS trenches and the pedestals being elongated, Y-direction-extending structures as shown in FIG. 4, the UMOS trenches in the device 200' shown in FIG. 5 have a grid configuration with the trenches forming the lines of a rectangular grid and the pedestal segments forming the apertures in the grid.

As shown in FIG. 5, the source region segments 238' extend along both X-direction sides of each of the sourced pedestal segments and not along the Y-direction ends of these pedestal segments. This device may be fabricated in the same manner as the device 200, except that after etching of the self-aligned Y-direction extending UMOS trenches, cross (X-direction extending) trenches are etched. Alternatively, rather than performing two separate etches, cross windows may be opened through the masking layer which protects the top of the pedestals so that a single etching step opens the entire grid-shaped trench. In either event, the base region is separated into segments 236' which are spaced apart in the Y-direction as well as the X-direction. It will be noted, that the structure of device 200' shown in FIG. 5 provides the same base region contact area to source region contact area ratio of 2:1 as does the device 200. However, it has less active area per unit of semiconductor body lower surface area.

In FIGS. 5-10, the gate and source electrodes are omitted for clarity.

Figure 6:
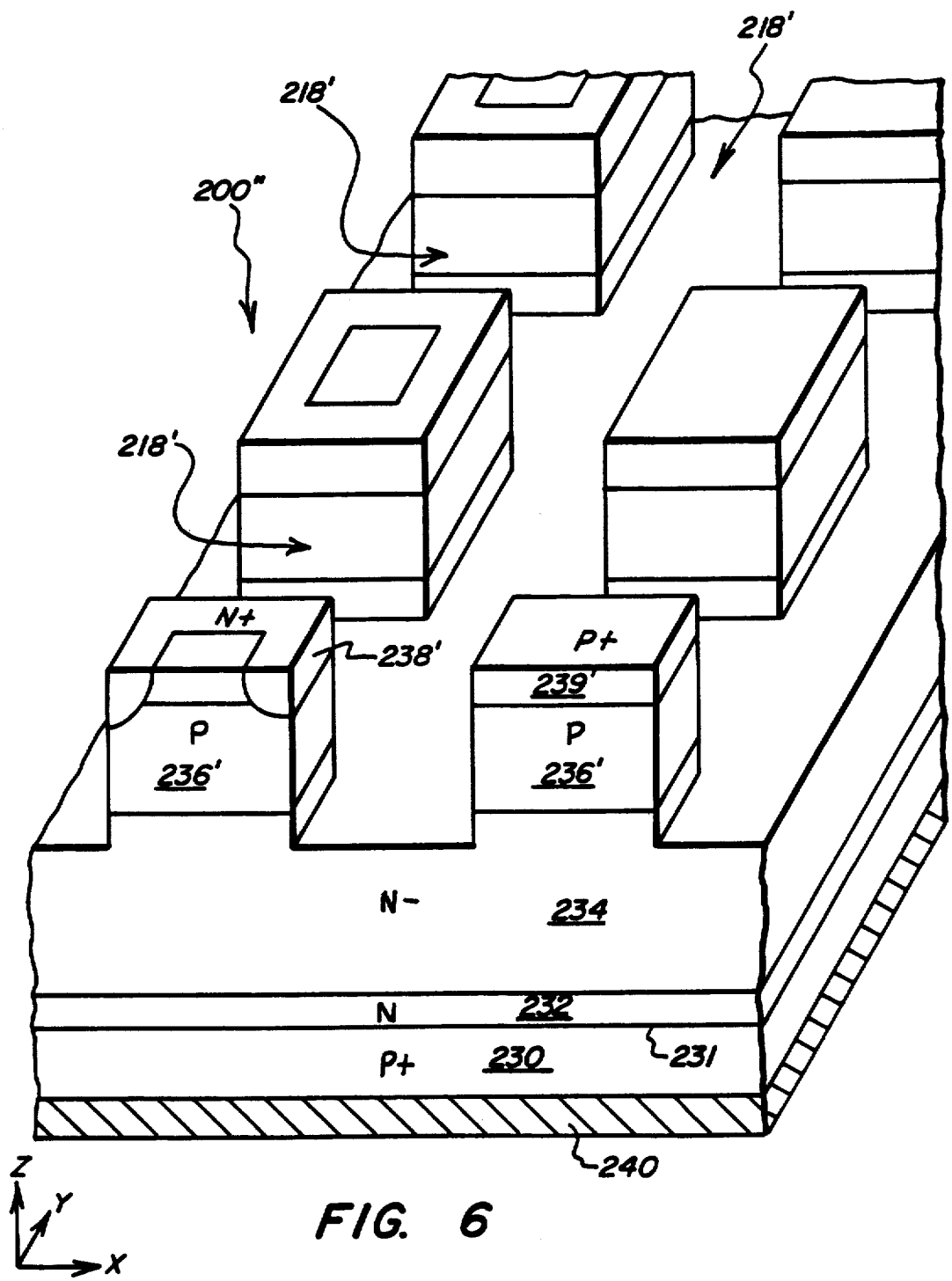

A further alternative embodiment 200" of a device in accordance with the present invention is illustrated is perspective, cross-section view in FIG. 6. The device 200" is like the device 200' except for the configuration of the source region. In the device 220", the source region segments 238" extend around the entire periphery of each sourced pedestal segment of the structure. This device structure may be fabricated by masking the upper surface of the wafer after base region formation, opening a grid-shaped window, blocking the sourceless pedestal area, diffusing the source region through that window to the desired extent under the mask layer, unblocking the sourceless pedestal area and then etching the UMOS trenches through that same grid-shaped window. The device 200'' provides a greater channel width per unit area than does the device 200'. However, the device 200'' provides substantially less base contact area than does the device 200'. Assuming a 3 micron wide pedestal in both the X- and Y-directions and 1 micron wide source regions, each sourced pedestal in the device 220'' has 8 square microns of source contact area and 1 square micron of base contact area. Since the sourceless pedestals have an area of 9 square microns, this yields a base contact area to source contact area ratio of 10:8 or 5:4. For this reason, the device structure 200' is preferred over the device structure 200''.

Further, the device structure 200 is preferred over the device structure 200' because the device structure 200 provides more active contact area and active device area per unit area of semiconductor wafer than does the device structure 200'.

Figure 7:
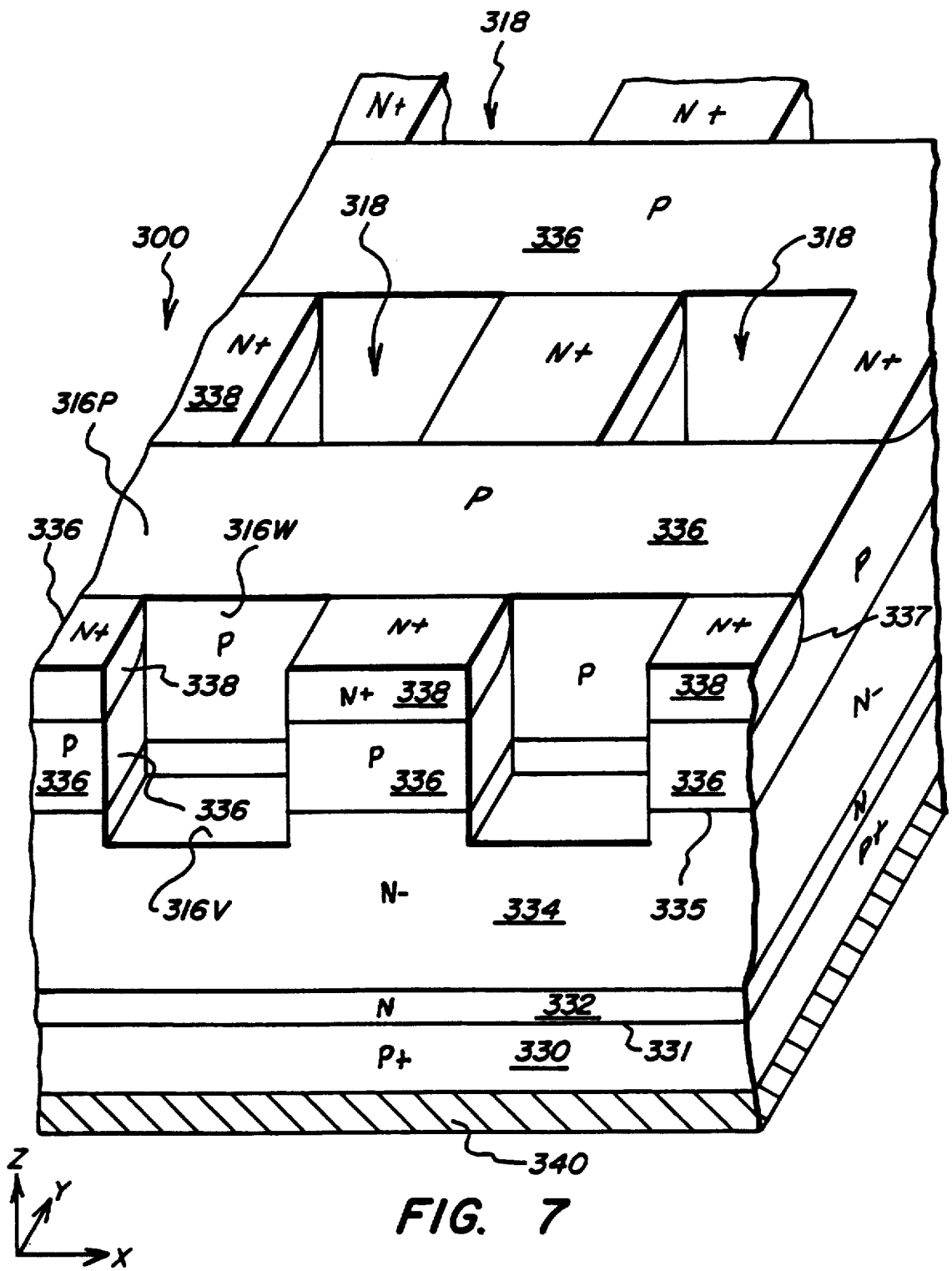
Figure 8:
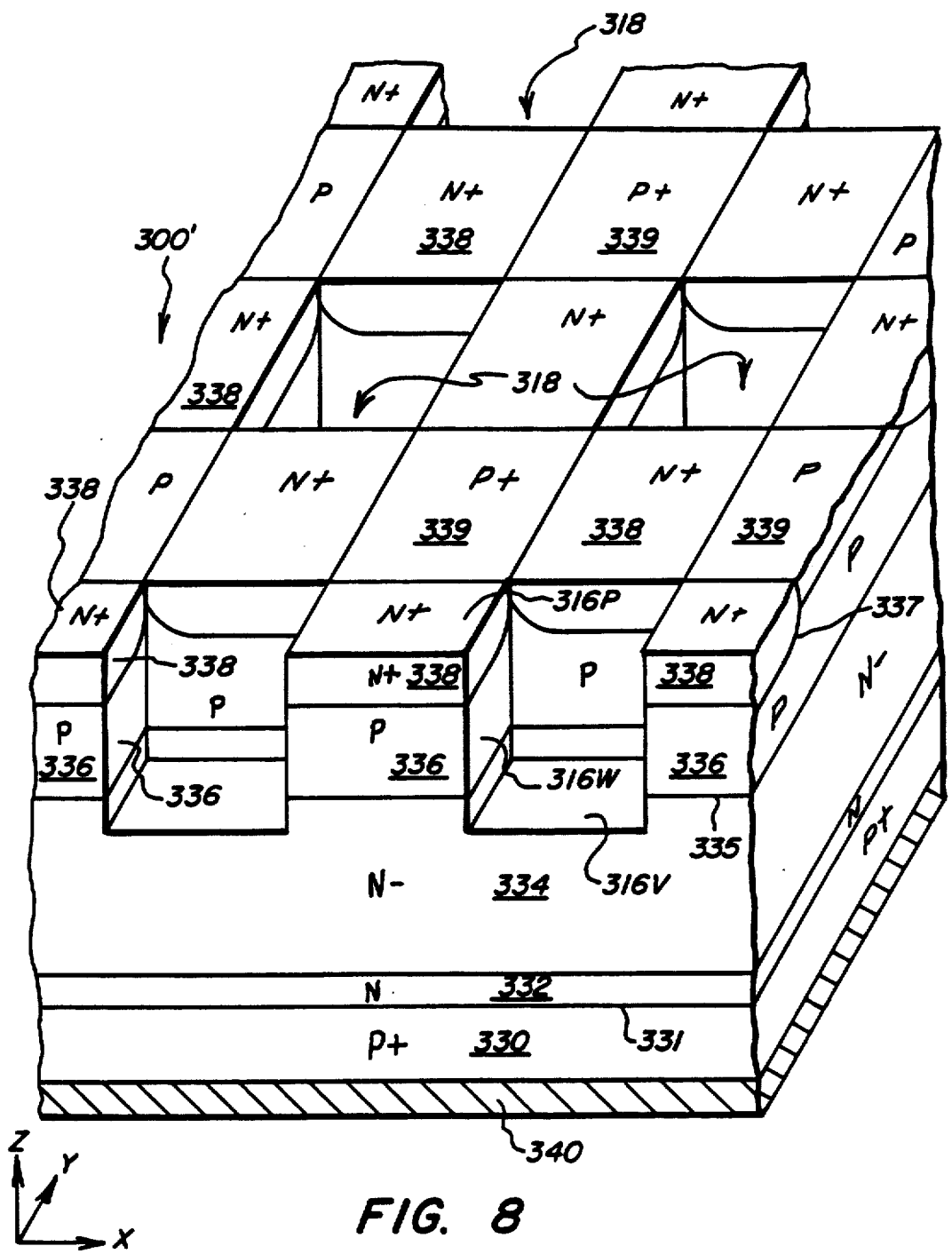

A further alternative embodiment 300 of a device in accordance with the present invention is illustrated in perspective cross-section form in FIG. 7. In this structure, the plateau surface 316P is in the form of a rectangular grid with the UMOS trenches 318 comprising apertures in that grid. In FIG. 7, reference numerals in the 300's are used and once again, reference numerals ending in the same two digits in FIG. 6 or one of the preceding figures identify corresponding structure and that structure is not discussed at this time except as it differs from prior configurations. For those portions of the structure which are not discussed here, the reader is referred to the discussion thereof in connection with an earlier figure.

Figure 9:
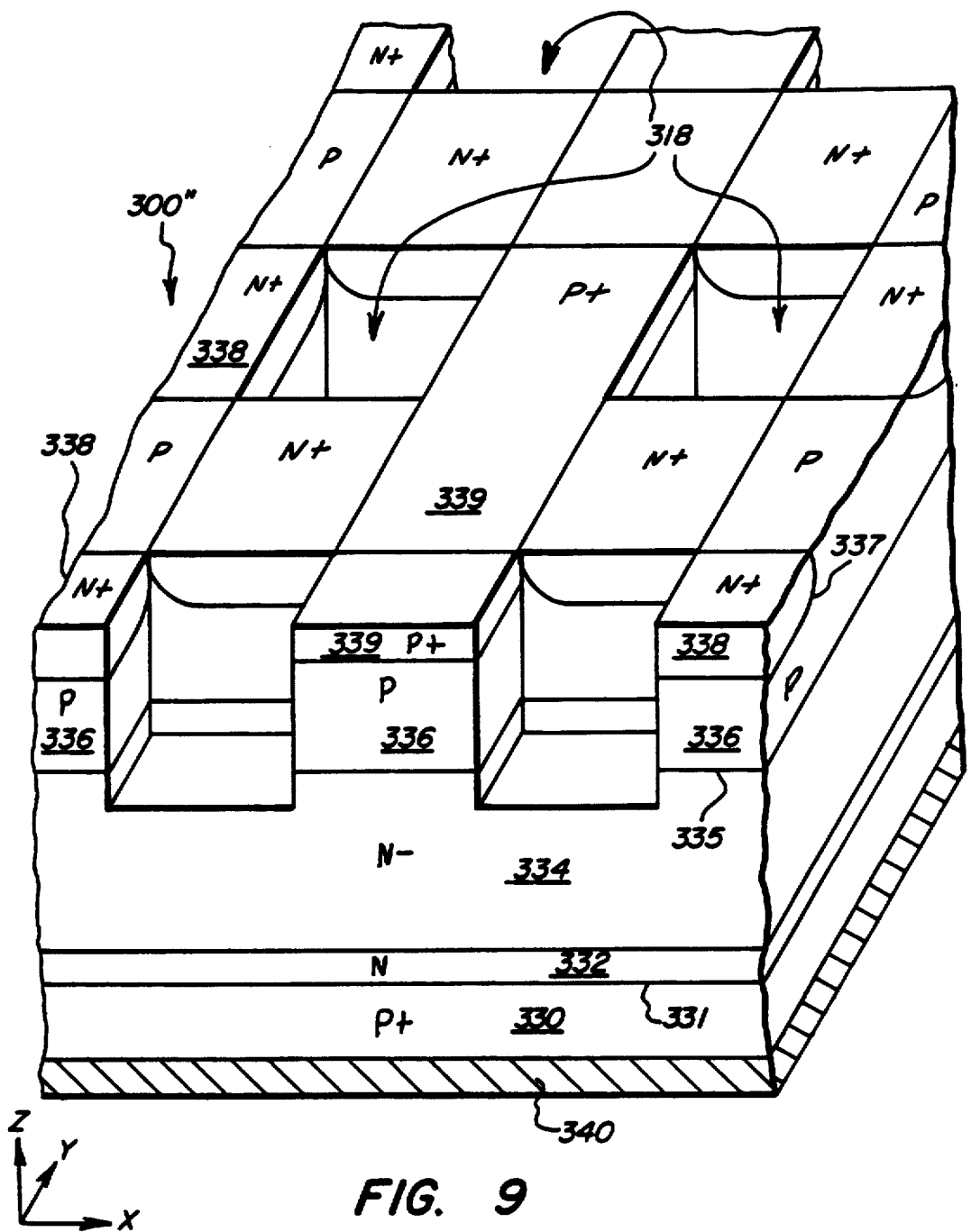

In the device 300 in FIG. 7, each of the source region segments 338 extends the full X-direction width of the pedestal segment on which it is disposed. This is similar to the situation in the device 100 of FIG. 3. In device 300, plateau surface of the X-direction extending segments of the grid structure are shown as being all P type base material. The structure shown in FIG. 7 has a base region to source region contact area ratio of 2:1. However, the maximum hole current path length along the base/source junction is increased over that of device 200. In particular, for trenches which are 3 microns wide and source regions which are 3 microns long in the Y direction by 1 micron deep, the shortest path from directly under the center of a source region segment to the base to source electrode contact is 2.02 microns, a 33% increase over device 200. In an alternative configuration 300' shown in FIG. 8, source regions are provided in the X-direction extending pedestal grid lines where they are adjacent to trenches in order to increase the channel width of the device. The structure of device 300' has a base region to source region contact area ratio of 1:2 which is likely to result in latching at high currents. A further alternative configuration 300'' is shown in FIG. 9 in which the structure of device 300' is modified by making every other Y-direction extending pedestal grid line all base material. This results in a base region to source region contact area ratio of 1:1.

A disadvantage of the device configurations 300, 300' and 300'' is the isolated nature of the gate electrodes in the individual trench segments. Connection of such individual gate electrodes creates a substantial problem in a single level metal process. However, where a double level metal process is utilized, these isolated gate electrodes can be connected together by first level metal with the second level metal then forming the source electrode and its contact area.

Figure 10:
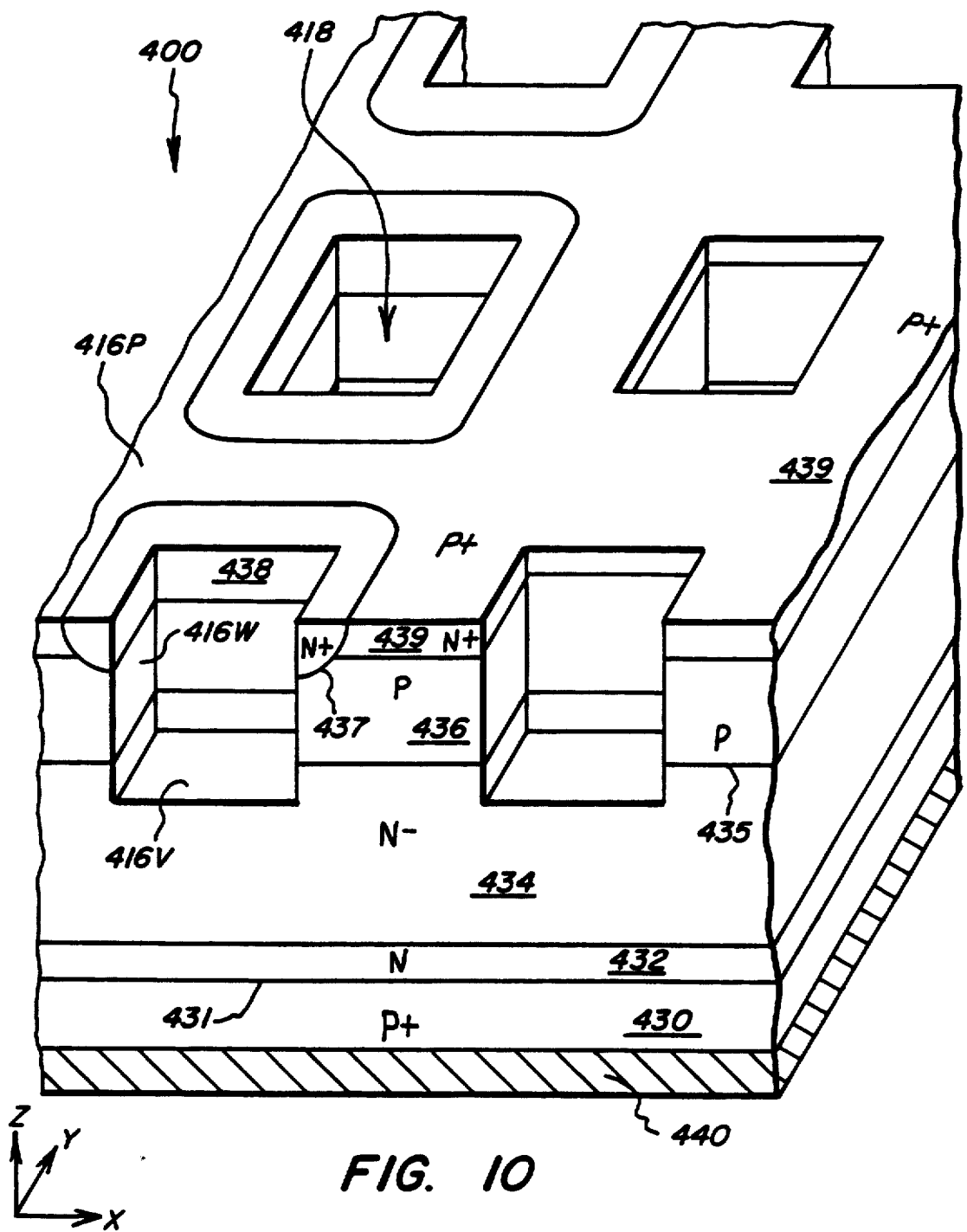

FIG. 10 is a perspective, cross-section illustration of a further alternative embodiment 400 of a device in accordance with the present invention. The device 400 is similar in concept to the device 200 in that source region is disposed along the entire length of the mesa or pedestal wall portion 416W of the structure and is everywhere spaced from the center of the plateau surface 416P of the structure. This device may be fabricated by opening source windows, diffusing the source region through the source windows and then etching the UMOS trenches through those same windows. This structure suffers from the same problem of isolated gate electrodes as the structure 300 does. However, these isolated gates can be connected together with double level metal.

For trenches which are 3 microns wide and pedestal segments which are 3 microns wide, the grid structure of the device 400 provides a base contact to source contact area ratio 19:8 which is higher than the 2:1 ratio provided by device 200. In addition, the device 400 provides more device active area per unit area of the semiconductor wafer than does the device 200. Where the active area is defined as the sum of the base and source region contact areas, the ratio of relative active areas for the device 400 and the device 200 is 3:2. Thus, the structure of device 400 provides a beneficial improvement over the device 200, provided the problem of isolated gate electrodes is overcome without adversely effecting this comparison.

While a number of embodiments of the present invention have been illustrated and described, it will be recognized that many other embodiments may be provided. In particular, although not shown, the elongated structures 100 and 200 of FIGS. 3 and 4, while shown as Y-direction extending parallel structures, may alternatively be configured as concentric (circular, square and so forth) structures without significant change in device operation. It will be recognized, that the conductivity types of all regions may be reversed in order to produce complementary devices. Semiconductor materials other than silicon may also be used.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A UMOS IGBT comprising:
    a body of semiconductor material having first and second opposed major surfaces;
    said first major surface having a substantially planar plateau portion, a valley portion interspersed with said plateau portion and a pedestal wall portion connecting said plateau and valley portions, said pedestal wall portion and said plateau portion together bounding a pedestal portion of said body of semiconductor material;
    a collector region of one type conductivity disposed adjacent said second major surface;
    a drift region of opposite type conductivity disposed adjacent said collector region, forming a first PN junction therewith and extending to said valley portion of said first major surface;

a base region of said one type conductivity disposed in said pedestal portion of said body adjacent to said drift region, forming a second PN junction with said drift region and extending to said pedestal wall and plateau portions of said first major surface;

a source region of said opposite conductivity type, said source region being disposed in said pedestal portion of said body, forming a third PN junction with said base region and extending to said plateau and pedestal wall portions of said first major surface;

an insulated gate electrode disposed on said pedestal wall portion of said first major surface adjacent said base region and extending from said source region to said drift region for controlling the conductivity of a channel portion of said base region extending between said source and drift regions;

a collector electrode disposed on said second major surface in ohmic contact with said collector region;

a source electrode disposed on said plateau portion of said first major surface in ohmic contact with said base region and said source region; and said base region comprising at least 40% of the area of said first major surface which is disposed in ohmic contact with said source electrode 2. The UMOS IGBT recited in claim 1 wherein:
said base region comprises at least 50% of said area of said first major surface which is disposed in ohmic contact with said source electrode.

3. The UMOS IGBT recited in claim 1 wherein:
said plateau portion of said first major surface and said pedestal portion of said body of semiconductor material each comprise a plurality of elongated, spaced apart segments.

4. The UMOS IGBT recited in claim 3 wherein:
said source region comprises a plurality of spaced apart segments.

5. The UMOS IGBT recited in claim 4 wherein:
some of said pedestal segments include a first portion which is free of source region segments and a second portion longitudinally separate therefrom which includes two source region segments.

6. The UMOS IGBT recited in claim 5 wherein:
in laterally adjacent pedestal segments a source region portion of one pedestal is laterally aligned with a source region free portion of the laterally adjacent pedestal.

7. The UMOS IGBT recited in claim 4 wherein:
said body of semiconductor material includes a plurality of first pedestal segments and a plurality of second pedestal segments;
each of said first pedestal segments is free of source region segments whereby in said first pedestal segments the entire contact area to said source electrode is base region area; and
each of said second pedestal segments includes a source region segment.

8. The UMOS IGBT recited in claim 7 wherein:
each of said second pedestal segments includes a gap in said source region whereby said base region extends to said plateau portion of said first surface and into ohmic contact with said source electrode.

9. The UMOS IGBT recited in claim 7 wherein:
in said second pedestal segments, said source region includes first and second spaced-apart segments.

10. The UMOS IGBT recited in claim 9 wherein:
each of said second pedestal segments has first and second opposed long sides and said first source region segment extends along said first long side of said pedestal and said second source region segment extends along said second long side of said pedestal.

11. The UMOS IGBT recited in claim 10 wherein:
said first and second source region segments are aligned across said pedestal; and
the portion of said base region extending to said plateau surface between said first and second source region segments includes a portion which is more heavily doped than the remainder of said base region.

12. The UMOS IGBT recited in claim 9 wherein:
said first and second source region segments are spaced apart in the direction of elongation of said pedestal.

13. The UMOS IGBT recited in claim 12 wherein:
said first and second source region segments each extend across said pedestal segment in a direction at an angle to said direction of elongation.

14. The UMOS IGBT recited in claim 7 wherein said source region includes:
an apertured source region segment disposed in one of said second pedestal segments, extending to the pedestal wall boundary of said pedestal segment along at least two sides of said pedestal segment and having at least one aperture therein which is spaced from said pedestal wall.

15. The UMOS IGBT recited in claim 14 wherein said apertured source region segment extends to the pedestal wall boundary of said pedestal segment along the entire periphery of said pedestal segment.

16. The UMOS IGBT recited in claim 1 wherein:
said plateau portion of said first major surface has a grid configuration;
said valley portion of said first major surface comprises a plurality of spaced apart segments each disposed in alignment with an opening in the plateau portion grid; and
said pedestal wall portion of said first major surface comprises a plurality of spaced apart segments each extending between one of said valley portion segments and said plateau portion.

17. The UMOS IGBT recited in claim 16 wherein:
said source region comprises a plurality of spaced apart segments.

18. The UMOS IGBT recited in claim 17 wherein said source region includes:
an apertured source region segment, said apertured segment surrounding an opening in said plateau grid which comprises an aperture in said segment, said segment being spaced from other openings in said grid by said base region.

19. The UMOS IGBT recited in claim 18 wherein:
said apertured source region segment has only one aperture therein.

20. The UMOS IGBT recited in claim 19 wherein:
said apertured source region segment is spaced from all other openings in said grid.

21. The UMOS IGBT recited in claim 18 wherein:
said apertured source region segment has a plurality of apertures therein, each comprising an opening in said grid.

22. The UMOS IGBT recited in claim 21 wherein:

said apertured source region segment is spaced from all grid openings which do not comprise an aperture therein.

23. The UMOS IGBT recited in claim 2 wherein said source region includes:
a plurality of source region segments each of which extends across a portion of said pedestal from a first pedestal wall segment of said first major surface to a second pedestal wall segment of said first major surface.

24. A UMOS IGBT comprising:
a body of semiconductor material having first and second opposed major surfaces, said body including:
a collector region of one type conductivity disposed adjacent said second major surface;
a drift region of opposite type conductivity disposed adjacent said collector region and forming a first PN junction therewith;
a base region of said one type conductivity disposed adjacent to said drift region, forming second PN junction therewith and being spaced from said collector region by said drift region;
a source region of said opposite conductivity type forming a third PN junction with said base region and being spaced from said drift region by said base region;
said base and source regions extending to a substantially planar portion of said first major surface;
a trench structure extending into said semiconductor body from said planar portion of said first major surface whereby said first major surface includes a pedestal wall portion which bounds a pedestal structure comprise of said base and source regions;
said base region including a channel portion disposed adjacent said pedestal wall portion of said first major surface and extending between said source region and said drift region;
an insulated gate electrode disposed on said pedestal wall portion of said first major surface adjacent said channel portion of said base region and extending from said source region to said drift region for controlling the conductivity of said channel portion of said base region between said source and drift regions for carriers of said opposite conductivity type;
a source region electrode disposed on said planar portion of said first major surface in ohmic contact with said base and source regions, the area of ohmic contact between said base region and said source region electrode being no less than two-thirds of the area of the ohmic contact between said source region and said source electrode; and
a collector electrode disposed on said second major surface in ohmic contact with said collector region.

25. The UMOS IGBT recited in claim 24 wherein:
said substantially planar portion of said first major surface comprises a plurality of parallel segments which are elongated in a first direction and spaced apart in a second direction perpendicular to said first direction whereby said pedestal comprises a plurality of parallel, elongated segments.

26. The UMOS IGBT recited in claim 24 wherein:
a plurality of said pedestal segments are free of source region segments.

27. The UMOS IGBT recited in claim 24 wherein:
said substantially planar portion of said first major surface has a grid configuration; and
said pedestal structure is comprised of a plurality of grid line segments and a plurality of grid intersection segments, each grid line segment extending between and connecting two of said grid intersection segments, each grid intersection segment connecting at least three of said grid line segments.

28. The UMOS IGBT recited in claim 27 wherein said IGBT includes a plurality of pedestal grid line segments which are free of source region segments.

29. The UMOS IGBT recited in claim 25 wherein:
in each pedestal segment, a pair of elongated source region segments are disposed, each extending in said first direction, and being spaced apart from each other in said second direction whereby in traversing said pedestal segment in said second direction at a location adjacent said planar portion of said first major surface, a source region segment is encountered, then a segment of said base region is encountered and then said second source region segment is encountered.

* * * * *